(12) United States Patent
Agrawal et al.

(10) Patent No.: US 8,913,655 B2
(45) Date of Patent: *Dec. 16, 2014

(54) FEED-FORWARD EQUALIZER ARCHITECTURES

(71) Applicant: International Business Machines Corporation, Armonk, NY (US)

(72) Inventors: Ankur Agrawal, White Plains, NY (US); John F. Bulzacchelli, Yonkers, NY (US); Daniel J. Friedman, Sleepy Hollow, NY (US); Zeynep Toprak Deniz, Norwalk, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/968,810

(22) Filed: Aug. 16, 2013

(65) Prior Publication Data

US 2013/0336378 A1 Dec. 19, 2013

Related U.S. Application Data

(63) Continuation of application No. 13/763,312, filed on Feb. 8, 2013.

(60) Provisional application No. 61/597,491, filed on Feb. 10, 2012.

(51) Int. Cl.

| H03H 7/30 | (2006.01) |
| H04L 27/01 | (2006.01) |
| H03K 5/135 | (2006.01) |
| H04L 25/03 | (2006.01) |
| H03K 5/00 | (2006.01) |

(52) U.S. Cl.
CPC .......... *H04L 25/03878* (2013.01); *H04L 27/01* (2013.01); *H03K 5/135* (2013.01); *H03K 2005/00065* (2013.01); *H03K 2005/00052* (2013.01)
USPC ............ 375/233; 375/229; 375/230; 375/232

(58) Field of Classification Search
CPC ............. H06L 25/03878; H03K 5/135; H03K 2005/00065; H03K 2005/00052
USPC .................. 375/233, 229, 230, 232
See application file for complete search history.

(56) References Cited

U.S. PATENT DOCUMENTS

| 3,716,807 A | 2/1973 | Sha et al. |
| 3,758,863 A | 9/1973 | Ungerboeck |

(Continued)

OTHER PUBLICATIONS

L. Chen et al., "A Scalable 3.6-to-5.2mW 5-to10Gb/s 4-Tap DFE in 32nm CMOS," IEEE International Solid-State Circuits Conference (ISSCC)—Digest of Technical Papers, Feb. 2009, pp. 180-181.

(Continued)

*Primary Examiner* — Dhaval Patel
(74) *Attorney, Agent, or Firm* — Anna V. Dougherty; Ryan, Mason & Lewis, LLP

(57) ABSTRACT

Circuits and methods are provided for efficient feed-forward equalization when sample-and-hold circuitry is employed to generate n time-delayed versions of an input data signal to be equalized. To equalize the input data signal, m data signals are input to m feed-forward equalization (FFE) taps of a current-integrating summer circuit, wherein each of the m data signals corresponds to one of the n time-delayed versions of the input data signal. A capacitance is precharged to a precharge level during a reset period of the current-integrating summer circuit. An output current is generated by each of the m FFE taps during an integration period of the current-integrating summer circuit, wherein the output currents from the m FFE taps collectively charge or discharge the capacitance during the integration period. A gating control signal is applied to an FFE tap during the integration period to disable the FFE tap during a portion of the integration period in which the data signal input to the FFE tap is invalid.

13 Claims, 12 Drawing Sheets

(56) References Cited

U.S. PATENT DOCUMENTS

| | | | |
|---|---|---|---|
| 5,388,123 | A | 2/1995 | Uesugi et al. |
| 5,530,721 | A | 6/1996 | Inoue et al. |
| 6,055,269 | A | 4/2000 | Drost et al. |
| 7,106,099 | B1 | 9/2006 | Nix |
| 7,283,586 | B2 | 10/2007 | Upton |
| 7,321,621 | B2 | 1/2008 | Popescu et al. |
| 7,542,508 | B2 | 6/2009 | Marlett et al. |
| 7,574,146 | B2 | 8/2009 | Chiang et al. |
| 7,738,567 | B2 | 6/2010 | Miller et al. |
| 7,809,054 | B2 | 10/2010 | Carballo et al. |
| 7,835,387 | B2 | 11/2010 | Agazzi et al. |
| 2002/0037031 | A1* | 3/2002 | Agazzi et al. ............ 375/220 |
| 2007/0058710 | A1 | 3/2007 | Chang |
| 2007/0133671 | A1 | 6/2007 | Tsai |
| 2008/0247453 | A1 | 10/2008 | An et al. |
| 2010/0046683 | A1 | 2/2010 | Beukema et al. |

OTHER PUBLICATIONS

A. Momtaz et al., "An 80 mW 40 Gb/s 7-Tap T/2-Spaced Feed-Forward Equalizer in 65 nm CMOS," IEEE Journal of Solid-State Circuits, Mar. 2010, pp. 629-639, vol. 45, No. 3.

H.R. Schindler et al., "Signal Correlator," www.ip.com, IPCOM000066351D, Feb. 2005, 3 pages.

N.P. Kelly et al., "A Mixed-Signal DFE/FFE Receiver for 100Base-TX Applications," IEEE International Solid-State Circuits Conference, 2000, 2 pages.

S. Sidiropoulos et al., "A 700-Mb/s/pin CMOS Signaling Interface Using Current Integrating Receivers," IEEE Journal of Solid-State Circuits, May 1997, pp. 681-690, vol. 32, No. 5.

* cited by examiner

100

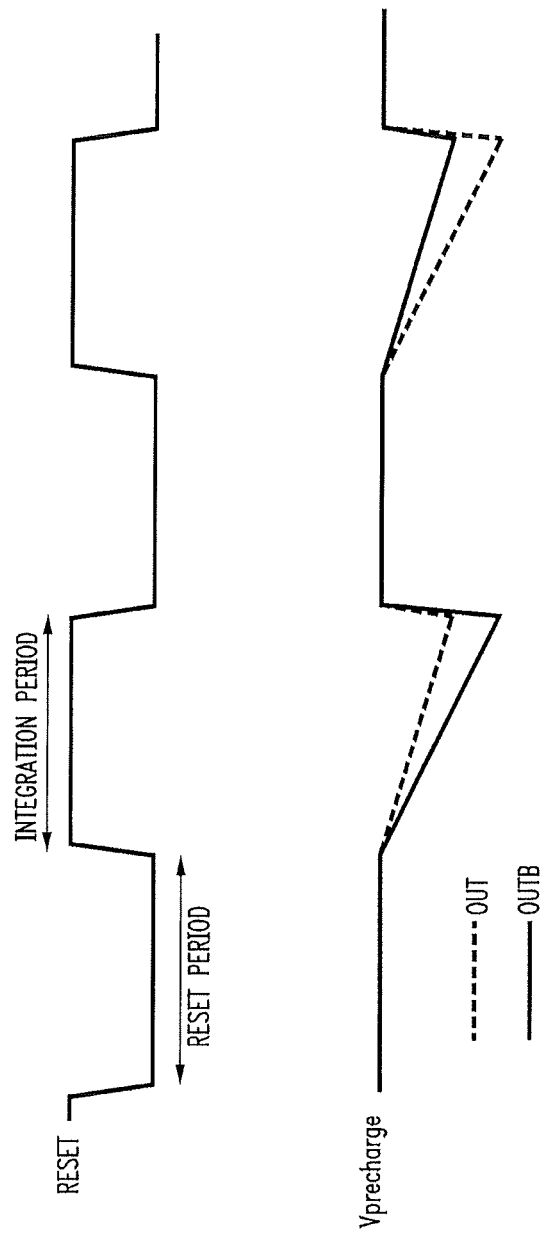

500

700

FEED-FORWARD EQUALIZER ARCHITECTURES

CROSS-REFERENCE TO RELATED APPLICATION

This application is a Continuation of U.S. patent application Ser. No. 13/763,312, filed on Feb. 8, 2013, which claims priority to U.S. Provisional Patent Application Ser. No. 61/597,491, filed on Feb. 10, 2012, the disclosures of which are incorporated herein by reference.

TECHNICAL FIELD

The field relates generally to equalization architectures and, in particular, circuits and methods for efficient implementation of feed-forward equalization architectures employing sample-and-hold circuitry.

BACKGROUND

A feed-forward equalization (FFE) circuit is a transversal filter that may be employed in multi-gigabit/s serial link transceivers to compensate for the frequency dependent loss of communication channels. Since these channels typically have a low-pass transfer function, an FFE is programmed to have high-pass characteristics to effectively compensate for the channel transfer function and reduce the intersymbol interference introduced by the channel. In principle, the FFE can be implemented in either the transmitter or the receiver.

Traditionally, FFE realization in the transmitter has been preferred due to its ease of implementation and lower power and area costs. However, placing the FFE in the transmitter has important disadvantages. Since the quality of the received signal is only known in the receiver, automatic adaptation of the FFE coefficients for optimum link performance requires a back channel from receiver to transmitter, something which is often unavailable (especially when the transmitter and receiver are sourced from different vendors). Since the peak voltage swing of the transmitter is limited by available supply voltages, transmit-side FFE compensates for high-frequency loss in the channel not by increasing the amplitudes of high-frequency signals but by decreasing the amplitudes of low-frequency signals. This results in a smaller received signal, which is more vulnerable to noise sources such as crosstalk.

One way to avoid the disadvantages of transmit-side FFE is to implement the equalizer in the receiver. To avoid the difficulties of implementing an actual receive-side FFE, peaking amplifiers are commonly employed in serial link receivers. However, peaking amplifiers do not provide enough flexibility in the placement of their poles and zeroes, making it difficult to accurately match the equalizer to the channel characteristics. Moreover, peaking amplifiers are not compatible with well-known equalizer adaptation algorithms (e.g. Least Mean Squares or LMS). Thus, there is a strong motivation to develop circuit techniques that overcome the practical difficulties of implementing receive-side FFE systems.

SUMMARY

Embodiments of the invention generally include equalization architectures and, in particular, circuits and methods for efficient implementation of feed-forward equalization architectures employing sample-and-hold circuitry.

In one embodiment of the invention, a feed-forward equalization circuit includes delay circuitry and a current-integrating summer circuit. The delay circuitry includes n parallel sample-and-hold circuits that are clocked by multiphase clocks to generate n time-delayed versions of an input data signal. The current-integrating summer circuit includes a first power supply node, an output node and a first switch connected between the first power supply node and the output node. The first switch is responsive to a reset control signal to connect the output node to the first power supply node and precharge a capacitance of the output node during a reset period of the current-integrating summer circuit, and to disconnect the output node from the first power supply node during an integrating period of the current-integrating summer circuit. The current integrating summer circuit further includes m transconductance amplifier circuits connected to the output node. Each of the m transconductance amplifier circuits receives as input a data signal that corresponds to one of the n time-delayed versions of the input data signal, and generates an output current on the output node. The output currents from the m transconductance amplifier circuits collectively charge or discharge the capacitance of the output node during the integration period. Further, at least one transconductance amplifier circuit of the m transconductance amplifier circuits includes a gating control circuit, wherein the gating control circuit is responsive to a gating control signal to disable the at least one transconductance amplifier circuit during a portion of the integration period in which the data signal input to the at least one transconductance amplifier circuit is invalid.

In another embodiment, a method is provided for equalizing a data signal. The method includes generating n time-delayed versions of an input data signal and inputting m data signals to m feed-forward equalization (FFE) taps of a current-integrating summer circuit. Each of the m data signals corresponds to one of the n time-delayed versions of the input data signal. A capacitance is precharged to a precharge level during a reset period of the current-integrating summer circuit. An output current is generated by each of the m FFE taps during an integration period of the current-integrating summer circuit, wherein the output currents from the m FFE taps collectively charge or discharge the capacitance during the integration period. A gating control signal is applied to at least one FFE tap of the m FFE taps during the integration period of the current-integrating summer circuit to disable the at least one FFE tap during a portion of the integration period in which the data signal input to the at least one FFE tap is invalid.

These and other embodiments of the invention will become apparent from the following detailed description of exemplary embodiments thereof, which is to be read in conjunction with the accompanying drawings.

BRIEF DESCRIPTION OF THE DRAWINGS

FIG. 4B shows example waveforms that illustrate an operating mode of the current-integrating amplifier circuit of FIG. 4A, according to an embodiment of the invention.

DETAILED DESCRIPTION

Figure 1:
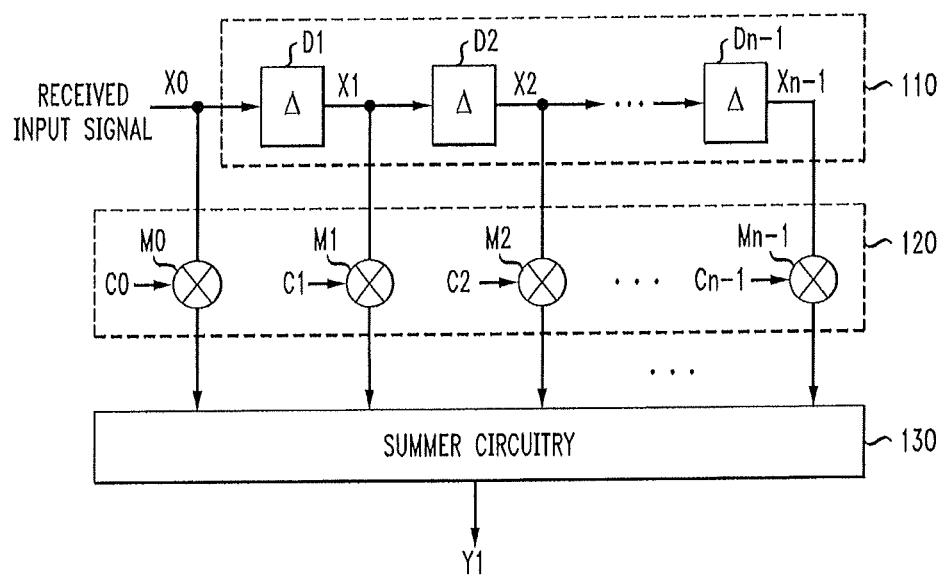
FIG. 1 is a block diagram of a feed-forward equalizer circuit.

FIG. 1 is a block diagram of a feed-forward equalizer architecture for which embodiments of the invention can be implemented. In particular, FIG. 1 illustrates a receive-side n-tap feed-forward equalizer circuit 100 comprising delay circuitry 110, multiplication circuitry 120 comprising a plurality of analog multipliers (M0, M1, . . . , Mn−1), and summer circuitry 130. The delay circuitry 110 comprises a plurality of delay cells (D1, D2, . . . , Dn−1). An input signal X0 is input to the delay circuitry 110, wherein the delay cells (D1, D2, . . . , Dn−1) generate respective delayed versions (X1, X2, . . . , Xn−1) of the input signal X0. The signals (X0, X1, X2, . . . , Xn−1) are input to respective analog multipliers (M0, M1, M2, . . . , Mn−1), where they are multiplied (weighted) with respective FFE weighting coefficients (C0, C1, C2, . . . , Cn−1). The outputs of the analog multipliers (M0, M1, M2, . . . , Mn−1) are summed in the summer circuitry 130 to generate an equalized signal Y1. In the embodiment of FIG. 1, the delayed signal X1 may be deemed a main-cursor, where the input signal X0 is a pre-cursor, and the delayed signals (X2, Xn−1) are post-cursors. Challenges in implementing an FFE circuit as shown in FIG. 1 include (a) generating time-shifted versions of the input analog signal, (b) performing coefficient multiplication and (c) summing up the weighted signals. As discussed in further detail below, exemplary embodiments of the invention include circuits and methods to address challenges (a) and (c) above.

The delay circuitry 110 can be implemented using analog delay circuitry that makes multiple time-delayed versions of the input data signal available simultaneously. Conceptually, the delay lines are analog shift registers that delay the incident data signal by a precise amount without introducing any distortions to the analog signal. The delay lines may be active or passive delay cells. In multi-gigabit/s wire line transceiver applications, where area and power efficiency are important considerations, these delay cells are undesirable for various reasons.

For instance, at high data-rates, the bandwidth of the delay cells should be greater than the signal bandwidth so that the delay cells do not distort the input signal. This requires active delay cells to have high current consumption, which is power-inefficient. Alternatively, if inductors are used to extend the bandwidth of the active delay cells, the area footprint of the delay cells is increased. Passive delay cells also require area-intensive components like inductors and capacitors. Furthermore, it is difficult to tune the amount of delay of the delay cells, limiting their use in transceivers that need to operate at a wide range of data-rates to comply with different networking standards.

Figure 2A:
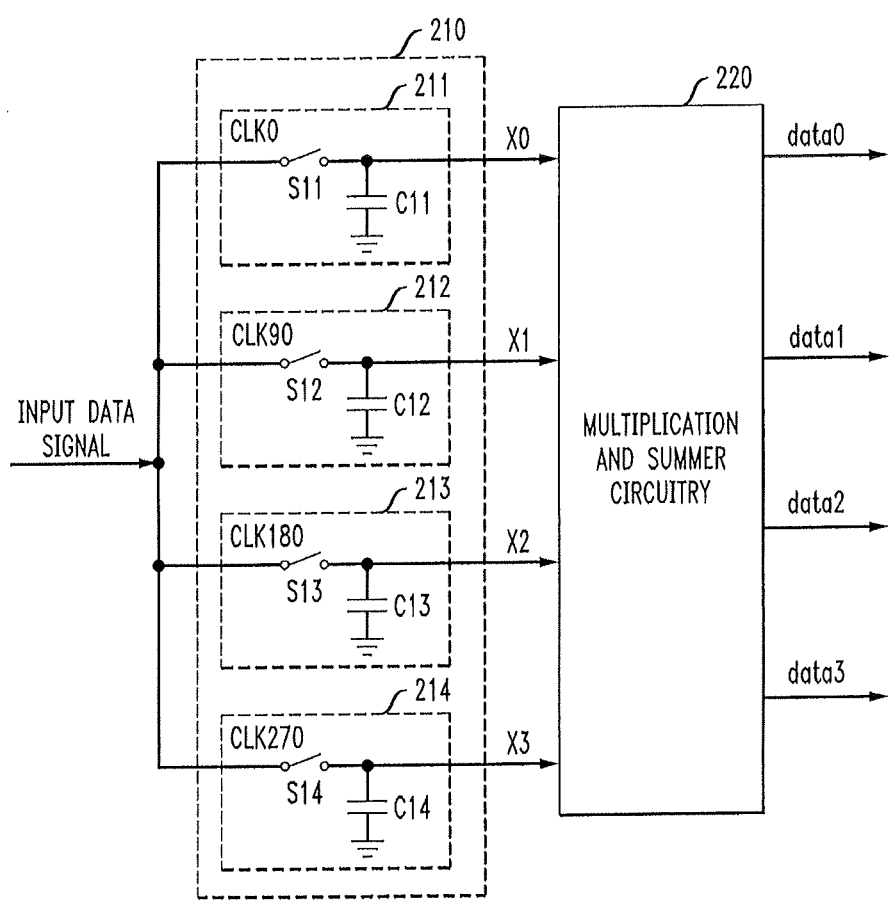
FIG. 2A is a block diagram of a feed-forward equalizer circuit comprising delay circuitry that is implemented using a plurality of sample-and-hold circuits to generate time-shifted data signals.

One way to implement the delay circuitry 110 of FIG. 1 is to use a bank of sample-and-hold (S/H) circuits which are clocked by multiphase clocks, to thereby generate multiple time-shifted versions of an input signal. For example, FIG. 2A is a block diagram of a feed-forward equalizer circuit comprising a bank of sample-and-hold circuits to generate time-shifted data signals. In particular, FIG. 2A illustrates a quarter-rate feed-forward equalizer circuit 200 comprising delay circuitry 210 and multiplication and summer circuitry 220. The delay circuitry 210 comprises four parallel sample-and-hold circuits 211, 212, 213 and 214, which sample an input data signal. A first sample-and-hold circuit 211 comprises a first switch S11 and a first capacitor C11. A second sample-and-hold circuit 212 comprises a second switch S12 and a second capacitor C12. A third sample-and-hold circuit 213 comprises a third switch S13 and a third capacitor C13. A fourth sample-and-hold circuit 214 comprises a fourth switch S14 and a fourth capacitor C14. The switches S11, S12, S13 and S14 of the respective sample-and-hold circuits 211, 212, 213 and 214 are switchably controlled by respective clock signals CLK0, CLK90, CLK180 and CLK270, which have distinct phases (i.e., 90 degrees phase shift) from each other.

An incoming data signal is input to each of the sample-and-hold circuits 211, 212, 213 and 214 and sampled at different times in response to activation of the respective switches S11, S12, S13, and S14 by the 90 degree phase-shifted signals CLK0, CLK90, CLK180, and CLK270, respectively. The signals X0, X1, X2, and X3 output from the sample-and-hold circuitry 210 represent time-delayed versions of the incoming data signal. The signals X0, X1, X2 and X3 output from the sample-and-hold circuitry 210 are input to the multiplication and summer circuitry 220, where the signals are multiplied by corresponding coefficients and summed to obtain FFE data outputs data0, data1, data2, and data3.

Figure 2B:
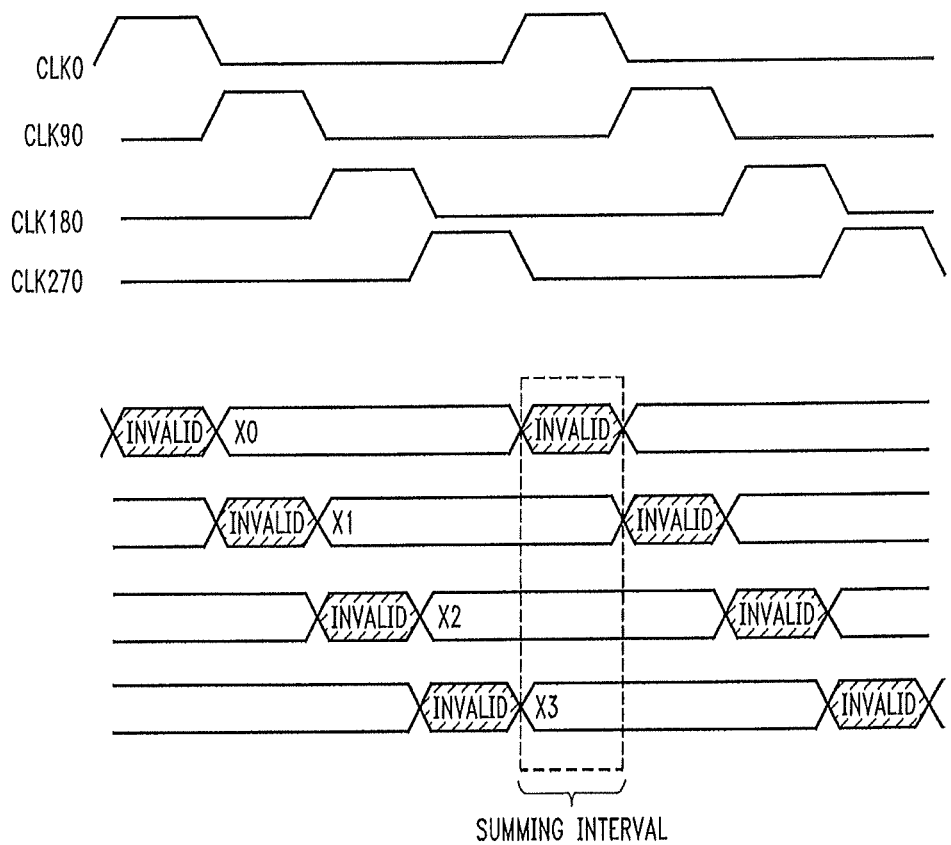
FIG. 2B shows example waveforms that illustrate an operating mode of the feed-forward equalizer circuit shown in FIG. 2A.

FIG. 2B shows example waveforms that illustrate an operating mode of the feed-forward equalizer circuit shown in FIG. 2A. In the exemplary quarter-rate receiver architecture, four phase-shifted quadrature clock signals CLK0, CLK90, CLK180 and CLK270 having 25% duty-cycle are shown, which control the sample-and-hold circuits 211, 212, 213 and 214, respectively. When the clock signals CLK0, CLK90, CLK180 and CLK270 are logic "high", the respective sample-and-hold circuits 211, 212, 213 and 214 will track their respective data signals, and their outputs are deemed invalid during this time of acquisition. Thus, each data signal X0, X1, X2, and X3 is held constant for three unit intervals (UIs) and is invalid in the fourth UI.

Although FIGS. 2A and 2B illustrate a quarter-rate receiver, these concepts equally apply for rates other than ¼. More generally, in a 1/n-rate receiver, there are n parallel sample-and-hold circuits and, if the clocks are high for one UI, each of the output data signals is held constant for (n−1) UI and invalid for one UI. Thus, at any given time instant, only (n−1) data samples are available for the FFE computation, implying that the FFE can have at most (n−1) taps. For example, as shown in FIG. 2B, a summing interval is one UI, and includes at most three data samples (e.g., X1, X2 and X3). Thus, for a quarter-rate receiver, only a 3-tap FFE may be implemented using a multi-phase sample-and-hold approach as shown in FIG. 2A.

Embodiments of the invention include FFE architectures that employ current-integrating summer circuitry as part of the multiplication and summer circuits (e.g., block 220 of FIG. 2A) to overcome the above-noted limitation on the number of taps in the equalizer when sample-and-hold circuits (e.g., block 210, FIG. 2A) are employed to generate the time-shifted input signals. As explained in further detail below, increasing a number of taps beyond the (n−1) limitation as noted above is achieved by using current-integrating summer circuitry and extending a summing interval (or integration interval) beyond 1 UI, whereby the FFE taps whose input data-signals are not available for the entire duration of the integration are enabled only when their inputs are being held by the S/H circuits. The current-integrating summer circuitry stores the contributions of the FFE taps for the remainder of the integration interval so that the proper FFE-equalized voltage can be sampled at the end of the integration period.

Figure 3:
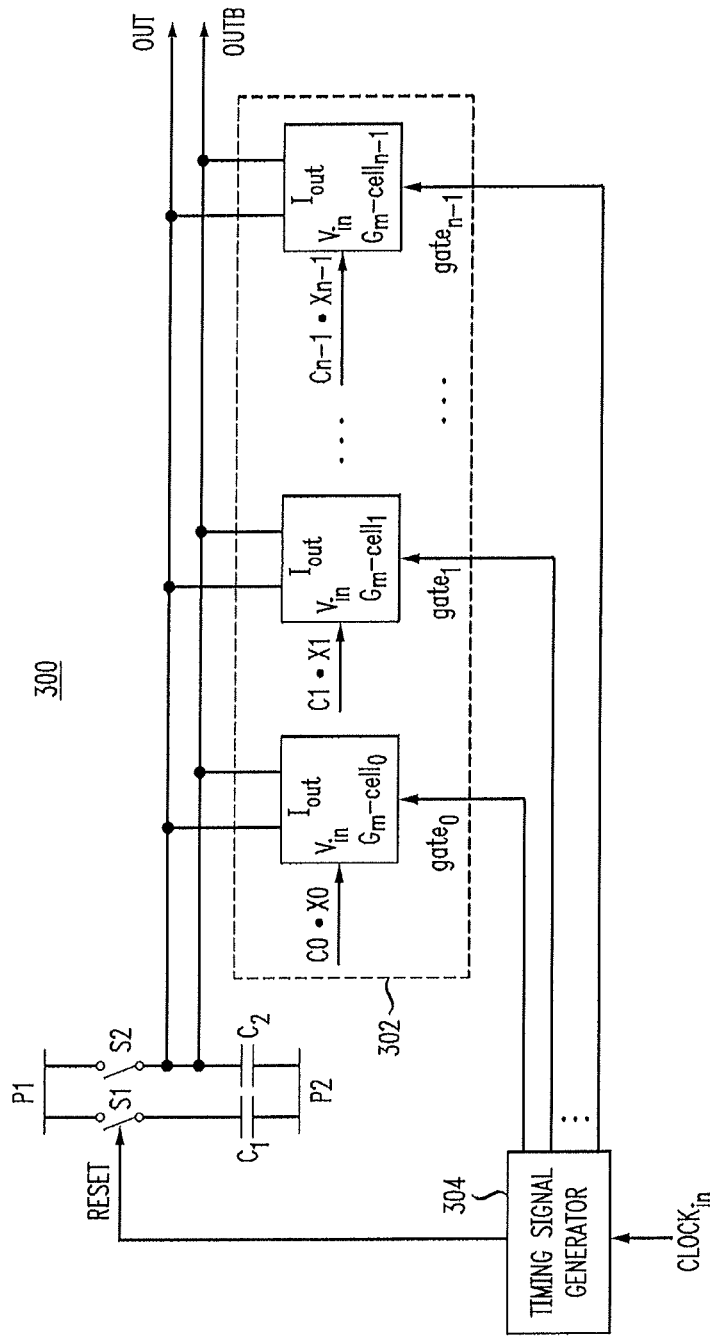
FIG. 3 is a block diagram of an n-tap current-integrating summer circuit for a feed-forward equalizer circuit, according to an embodiment of the invention.

For example, FIG. 3 is a block diagram of a current-integrating summer circuit according to an embodiment of the invention. In particular, FIG. 3 illustrates an embodiment of a current-integrating summer circuit 300 that can be implemented in a feed-forward equalizer circuit to achieve an extended tap range. The current-integrating summer circuit 300 comprises a plurality of transconductance cells 302 (or $G_m$-cells) whose output nodes are commonly connected to first and second differential output nodes OUT and OUTB. The transconductance cells 302 shown in FIG. 3 comprise a plurality (n) of $G_m$-cells ($G_m$-cell$_0$, $G_m$-cell$_1$, ..., $G_m$-cell$_{n-1}$) for implementing an n-tap feed-forward equalizer, as will be explained in further detail below. The current-integrating summer circuit 300 further comprises first and second switches S1 and S2, first and second capacitors $C_1$ and $C_2$, and a timing signal generator circuit 304. The first and second switches S1 and S2 are connected between a first power supply node P1 and the first and second differential output nodes OUT and OUTB, respectively. The first and second capacitors $C_1$ and $C_2$ are connected between a second power supply node P2 and the first and second differential output nodes OUT and OUTB, respectively. In one embodiment of the invention, the first and second power supply nodes P1 and P2 may be connected to the same power supply voltage (e.g., VDD). In another embodiment, the first and second power supply nodes P1 and P2 may be connected to different power supply voltages. In another embodiment, one of the first and second power supply nodes P1 and P2 may be grounded and the other one connected to a power supply voltage.

The timing signal generator circuit 304 generates a reset control signal to switchably control the first and second switches S1 and S2. In addition, the timing signal generator circuit 304 generates a plurality of gating control signals, gate$_0$, gate$_1$, ..., gate$_{n-1}$, which are input to respective transconductance cells $G_m$-cell$_0$, $G_m$-cell$_1$, ..., $G_m$-cell$_{n-1}$, to enable or disable the respective transconductance cells depending on the polarity of the gating control signals. When the first and second switches S1 and S2 are closed (activated) in response to the reset control signal, the first and second capacitors C1 and C2 are connected to the first power supply node P1 and precharged to a voltage $V_{precharge}$. When switches S1 and S2 are opened (deactivated) in response to the reset signal, the first and second capacitors $C_1$ and $C_2$ integrate the output currents ($I_{out}$) from each of the transconductance cells 302 to develop a differential voltage at the first and second differential output nodes OUT and OUTB.

Figure 4A:
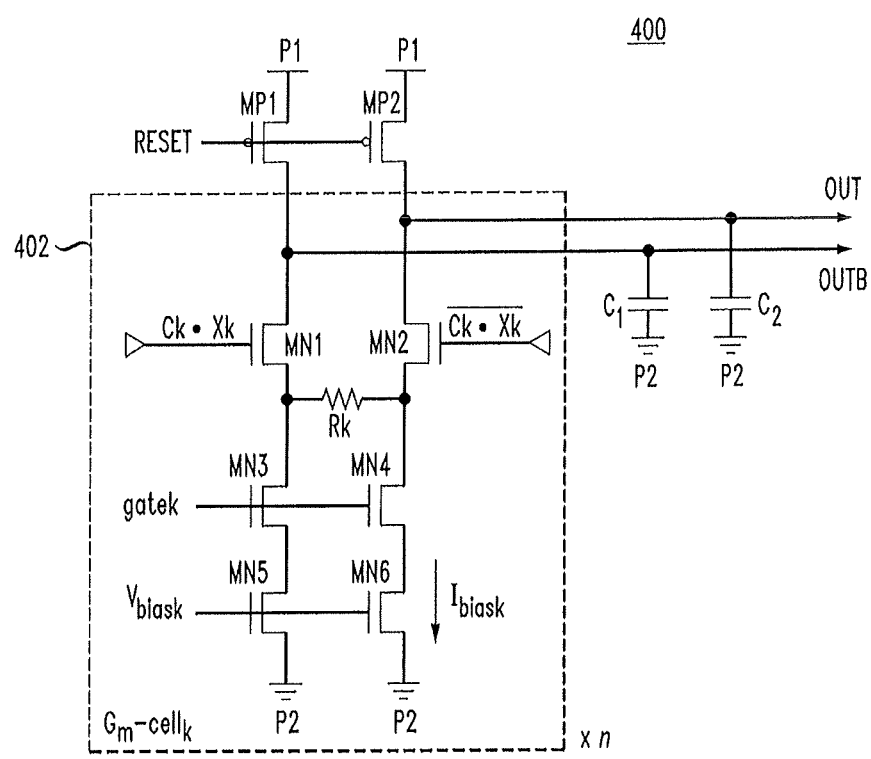
FIG. 4A is a schematic circuit diagram of a current-integrating amplifier circuit according to an embodiment of the invention, which can be used to implement the n-tap current-integrating summer circuit shown in FIG. 3.

FIG. 4A is a schematic circuit diagram of a current-integrating amplifier circuit according to an embodiment of the invention, which can be used to implement the n-tap current-integrating summer circuit shown in FIG. 3. In particular, FIG. 4A shows a current-integrating amplifier circuit 400 comprising a transconductance cell 402 (more generally, $G_m$-cell$_k$), first and second PMOS transistors MP1 and MP2, and first and second capacitors $C_1$ and $C_2$. The first and second PMOS transistors MP1 and MP2 are connected between a first power supply node P1 and first and second differential output nodes OUT and OUTB, respectively. The PMOS transistors MP1 and MP2 are embodiments of the first and second switches S1 and S2 shown in FIG. 3. The first and second capacitors C1 and C2 are connected between the first and second differential output nodes, respectively, and a second power supply node P2 (e.g., ground).

As further depicted in FIG. 4A, the transconductance cell 402 comprises a differential input stage comprising a differential input pair of NMOS transistors MN1 and MN2, a source degeneration resistor Rk, NMOS switches MN3 and MN4, and NMOS tail transistors MN5 and MN6. The differential input pair of transistors MN1 and MN2 have gate terminals that receive differential input signals Ck·Xk and $\overline{Ck \cdot Xk}$, respectively, wherein Xk denotes a data input for the given transconductance cell 402 and Ck is the weight value applied to the data input Xk for the given transconductance cell 402. The differential input pair of transistors MN1 and MN2 have drain terminals that are connected to the first and second differential output nodes OUT and OUTB, respectively. The first and second capacitors $C_1$ and $C_2$ serve as resettable load capacitors for the differential input pair of transistors MN1 and MN2. For highest power efficiency, the first and second capacitors $C_1$ and $C_2$ may be realized as parasitic capacitances of associated wiring and devices.

Moreover, the NMOS transistors MN3 and MN4 have commonly connected gate terminals that receive a gating control signal, gatek which serves to enable or disable the transconductance cell 402. The tail transistors MN5 and MN6 are NMOS transistors that serve as tail current sources to generate a bias current $I_{biask}$ to bias the differential input stage, based on a bias voltage $V_{biask}$ that is commonly applied to the gate terminals of transistors MN5 and MN6. The degeneration resistor Rk and two separate tail current sources MN5 and MN6 provide resistive source degeneration, which improves the linearity of the transconductance cell 402.

FIG. 4B shows example waveforms that illustrate an operating mode of the current-integrating amplifier circuit 400 of FIG. 4A, according to an embodiment of the invention. FIG. 4B illustrates a reset control signal that is applied to the gate terminals of the PMOS transistors MP1 and MP2. The reset control signal is a clock waveform, alternating between high and low voltage levels, which sets a "reset period" and an "integration period" of the current-integrating amplifier circuit 400. FIG. 4B further illustrates output voltage waveforms that are generated on the first and second differential output nodes OUT and OUTB. Although FIG. 4B does not specifically show a gating control signal gatek, it is assumed in FIG. 4B that the gating control signal is asserted such that the transconductance cell 402 is enabled at all times, or at least enabled during the integration period shown in FIG. 4B. In operation, when the reset control signal is logic low, the current-integrating amplifier circuit 400 is in reset mode for a given "reset period." During the reset period, the PMOS transistors MP1 and MP2 are activated (turned on) in response to a logic low level of the reset control signal applied to the gate terminals thereof. With PMOS transistors MP1 and MP2 activated, the first and second differential output nodes OUT and OUTB are pulled up to the first power supply node P1 and precharged to a voltage level Vprecharge (e.g., approximately VDD).

As further shown in FIG. 4B, when the reset control signal transitions to logic high, the current-integrating amplifier circuit 400 enters an integration mode for a given "integration period." During the integration period, the PMOS transistors MP1 and MP2 are deactivated (turned off) in response to a logic high level of the reset control signal applied to the gate terminals thereof. With PMOS transistors MP1 and MP2 deactivated, the drain currents of the differential input pair of NMOS transistors MN1 and MN2 (which are driven by respective inputs Ck·Xk and $\overline{Ck·Xk}$) begin to discharge the first and second load capacitors $C_1$ and $C_2$. During the "integration" period, charge is integrated (negatively) on the first and second capacitors $C_1$ and $C_2$, thereby generating a differential voltage on the output nodes OUT and OUTB proportional to the input signal and the gain of the stage. With a nonzero differential input voltage, the drain currents from the differential input pair of NMOS transistors MN1 and MN2 are unequal, so the output nodes OUT and OUTB are discharged at different rates. A positive or negative differential output voltage is developed by the end of the integration period, as indicated by the voltage waveforms of the differential output nodes OUT and OUTB, as shown in FIG. 4B. When the reset control signal transitions to logic low again, the PMOS switches MP1 and MP2 are again turned on, and the differential output nodes OUT and OUTB are pulled up to the first power supply node P1 and precharged to a voltage level Vprecharge (e.g., approximately VDD).

Figure 5:
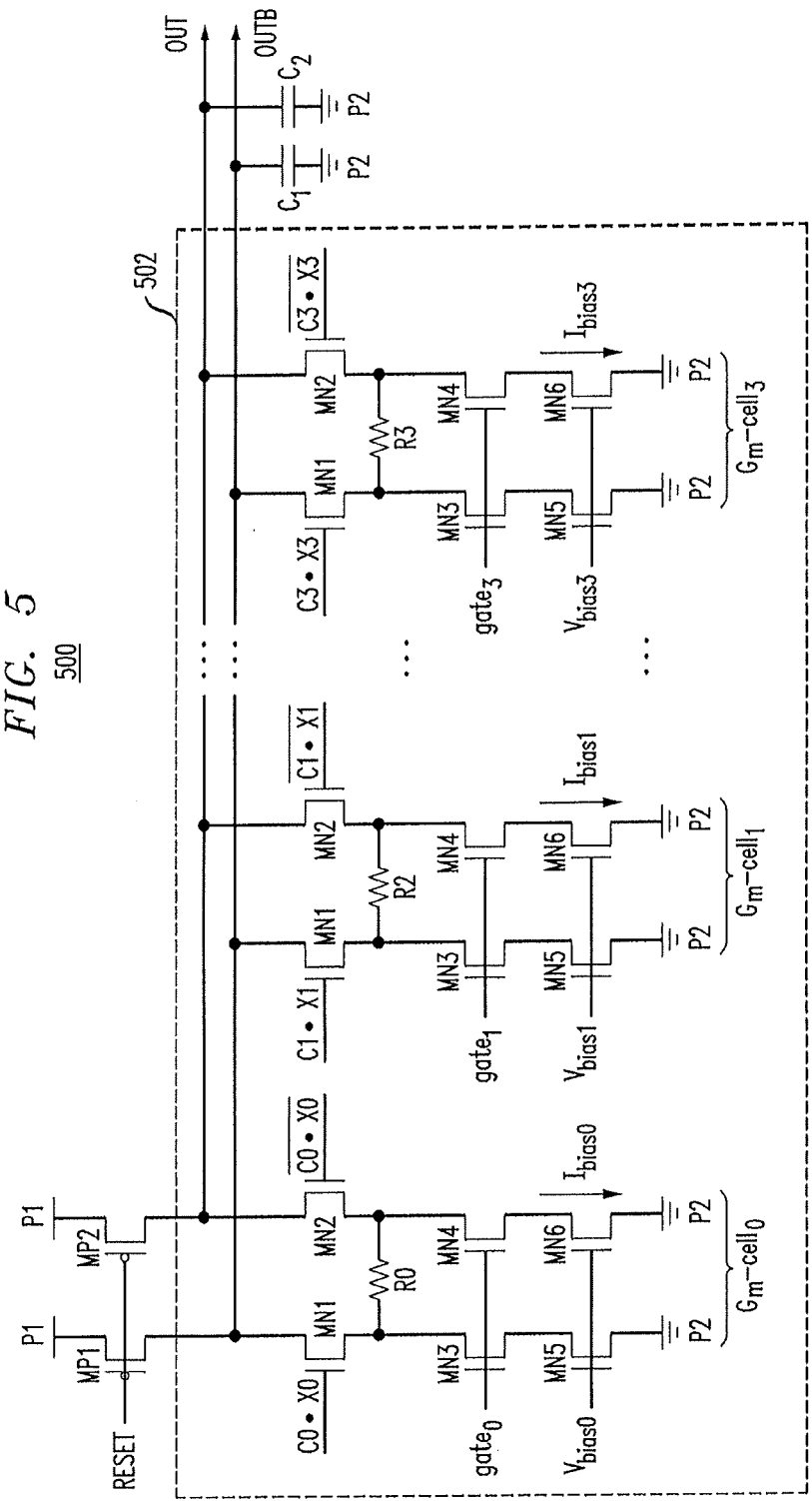
FIG. 5 is a schematic circuit diagram of a 4-tap current-integrating summer circuit for a feed-forward equalizer circuit, which is based on the circuit structures of FIGS. 3 and 4A, according to an embodiment of the invention.

FIG. 5 is a schematic circuit diagram of a 4-tap current-integrating summer circuit for a feed-forward equalizer circuit, which is based on the circuit structures of FIGS. 3 and 4A, according to an embodiment of the invention. In particular, FIG. 5 illustrates a 4-tap current-integrating summer circuit 500 which is based on the framework shown in FIG. 3, wherein the 4-tap current-integrating summer circuit 500 comprises a plurality of transconductance cells 502 which includes four $G_m$-cells ($G_m$-cell$_0$, $G_m$-cell$_1$, ..., $G_m$-cell$_3$). Each of the transconductance cells ($G_m$-cell$_0$, $G_m$-cell$_1$, ..., $G_m$-cell$_3$) has topology that is based on the transconductance cell 402 shown in FIG. 4A. For clarity, the third transconductance cell (i.e., $G_m$-cell$_2$) is not shown in FIG. 5, and it is assumed that the transconductance cell $G_m$-cell$_2$ represents the main cursor of the 4-tap architecture.

As shown in FIG. 5, each transconductance cell 502 comprises a differential input stage including a differential input pair of NMOS transistors MN1 and MN2 which receive differential input signals (C0·X0/$\overline{C0·X0}$), (C1·X1/$\overline{C1·X1}$), (C2·X2/$\overline{C2·X2}$), and (C3·X3/$\overline{C3·X3}$), respectively, wherein X0, X1, X2 and X3 denote the data inputs for the respective transconductance cells 502 and C0, C1, C2 and C3 denote a respective weight value applied to the respective data inputs X0, X1, X2 and X3. Furthermore, each transconductance cell 502 comprises a respective source degeneration resistor R0, R1, R2 and R3. Moreover, each transconductance cell 502 comprises NMOS transistors MN3 and MN4 that receive respective gating control signals gate$_0$, gate$_1$, gate$_2$, and gate$_3$, which serve to enable or disable the respective transconductance cell 502. Furthermore, each transconductance cell 502 comprises tail transistors MN5 and MN6 that serve as tail current sources to generate respective bias currents $I_{bias0}$, $I_{bias1}$, $I_{bias2}$, and $I_{bias3}$ based on respective bias voltages $V_{bias0}$, $V_{bias1}$, $V_{bias2}$, $V_{bias3}$.

In the structure shown in FIG. 5, the drain terminals of each linear source-degenerated transconductance stage 502, whose input voltages represent the product of the data signals and coefficients, are dotted together so that the currents proportional to each term in the FFE computation are summed up at the output nodes OUT and OUTB. In some embodiments, the input voltages to the transconductance stages 502 are the data signals X0, X1, X2, X3, wherein coefficient multiplication is implemented by varying the value of the source degeneration resistors R0, R1, R2, and R3 to change the effective transconductance of each of the stages. In other embodiments, different multiplication factors can be achieved by changing the size (ratio) of the differential input transistors MN1/MN2 to achieve different Gm values for each stage, or by varying the bias voltages to obtain different bias currents for the different stages, etc. In all embodiments, since the output terminals of each of the transconductance cells 502 are commonly connected to the differential output nodes OUT and OUTB, the currents from the different transconductance cells 502 are summed by "dotting", and the discharge rate of the differential output nodes during an integration interval represents the mathematical addition of the multiple input signals (weighted by the transconductances of the respective input stages).

Figure 6:
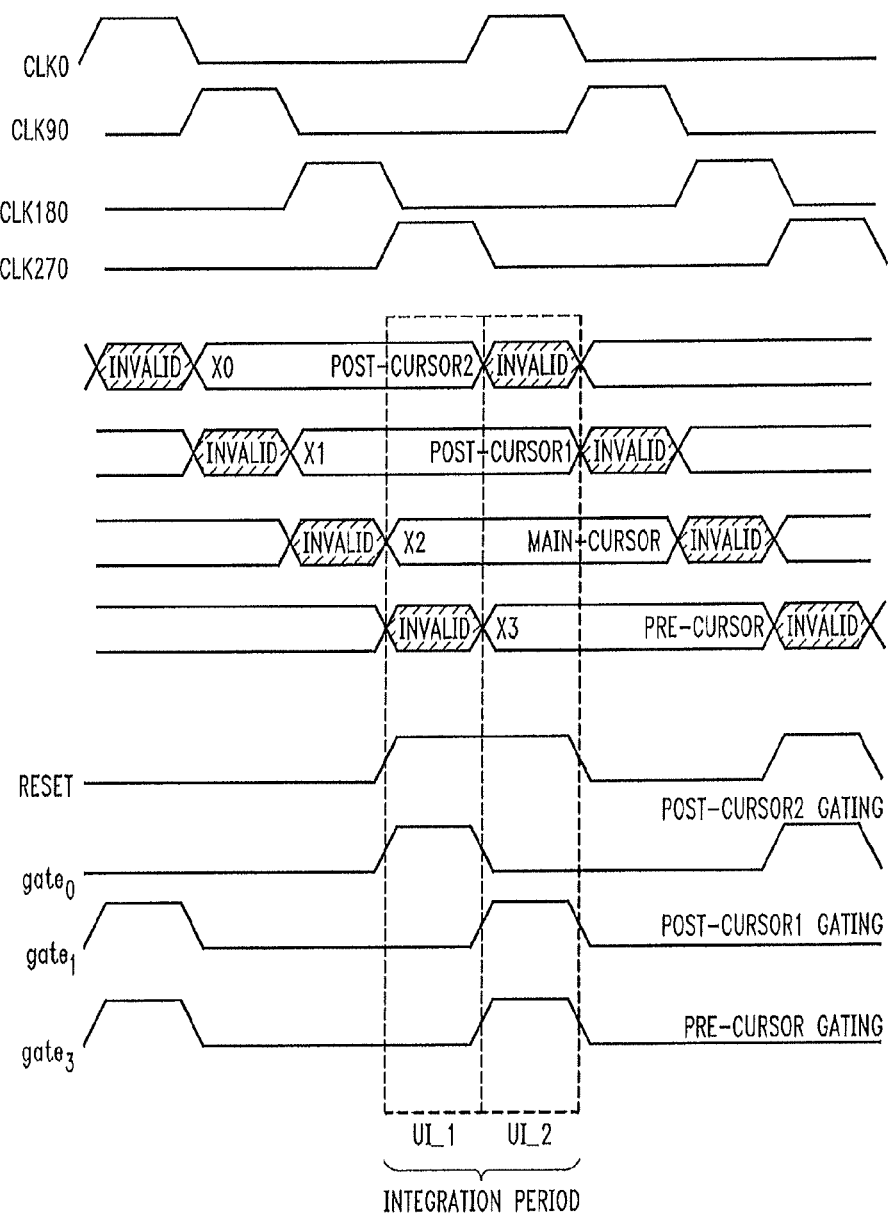
FIG. 6 shows example waveforms that illustrate an operating mode of a quarter-rate feed-forward equalizer circuit that employs the 4-tap current-integrating summer circuit of FIG. 5, according to an embodiment of the invention.

FIG. 6 shows example waveforms that illustrate an operating mode of a quarter-rate feed-forward equalizer circuit that employs the 4-tap current-integrating summer circuit of FIG. 5, according to an embodiment of the invention. FIG. 6 shows four phase-shifted quadrature clock signals CLK0, CLK90, CLK180 and CLK270 having a 25% duty-cycle for a quarter-rate receiver architecture. For purposes of illustration, it is assumed that the four phase-shifted quadrature clock signals CLK0, CLK90, CLK180 and CLK270 control respective sample-and-hold circuits 211, 212, 213 and 214, of the sample and hold circuitry 210 shown in FIG. 2A. FIG. 6 further shows 4 data sample waveforms X0, X1, X2 and X3 that are generated using the sample and hold circuitry 210 of FIG. 2A in response to the four quadrature clock signals CLK0, CLK90, CLK180 and CLK270. FIG. 6 further shows a plurality of control signals including a reset signal and a plurality of gating signals gate$_0$, gate$_1$, and gate$_3$ In the embodiments of FIGS. 5 and 6, it is assumed that the transconductance cell $G_m$-cell$_2$ (not specifically shown in FIG. 5) and corresponding data input X2 represent the main cursor FFE tap, the data input X0 is a second post-cursor, the data input X1 is a first post-cursor, and that the data input X3 is a pre-cursor.

In the framework of FIG. 5, a 4-tap FFE is implemented by extending an "integration period" to 2 UI_, UI_1 and UI_2, and then using gating signals, gate$_o$, gate$_1$ and gate$_3$, to ensure that the proper FFE-equalized voltage is produced by the 4-tap current-integrating summer circuit of FIG. 5. In particular, as shown in FIG. 6, the reset control signal has a 50% duty cycle to provide an "integration period" of two UIs, a first UI_1 and a second UI_2. With an "integration period" of two UIs, there exists some period of time in which each data signal (X0, X1, X2 or X3) is active and valid so that a 4-tap FFE can be implemented. This is to be contrasted with the operating mode shown in FIG. 2B where an integration period (or summing interval) of one UI allows only three data inputs (X1, X2 and X3) to contribute to the FFE computation.

Moreover, while certain data inputs (e.g., X0 and X3) are both valid and invalid at certain points of time during the integration period, the gating control signals operate to disable the respective transconductance cells at times when the data inputs are not valid. For instance, as shown in FIG. 6, since the data signal X0 is invalid during the second unit interval UI_2 of the integration period, the gating control signal gate$_0$ is only asserted during the first unit interval UI_1 of the integration period, and de-asserted during the second unit interval UI_2 of the integration period. As such, the transconductance cell G$_m$-cell$_0$ of FIG. 5 is disabled during the second unit interval UI_2 of the integration period in response to logic low gating control signal gate$_0$, so that the invalid data X0 does not contribute to the FFE computation. In addition, as further shown in FIG. 6, since the data signal X3 is invalid during the first unit interval UI_1 of the integration period, the gating control signal gate$_3$ is only asserted during the second unit interval UI_2 of the integration period, and de-asserted during the first unit interval UI_1 of the integration period. As such, the transconductance cell G$_m$-cell$_3$ of FIG. 5 is disabled during the first unit interval UI_1 of the integration period, so that the invalid data X3 does not contribute to the FFE computation. In this manner, the gating control signals serve to disable the transconductance cells from outputting current during periods in which their respective data inputs are not valid, thereby preventing the final FFE-equalized voltage from being corrupted by invalid data-input signals during the integration period.

On the other hand, for FFE taps that are available for the entire duration of integration period, such as the first post-cursor X1 and main-cursor X2 as shown in FIG. 6, the use of gating control signals is optional, or gating control signals can be used for other purposes. For example, in one embodiment of the invention, the gating control logic and gating circuit (e.g., gating transistors MN3 and MN4 of FIG. 5) may be omitted altogether for those taps in which the input data is always valid during the integration period. For example, as shown in FIG. 6, the data inputs X1 and X2 are valid during both the first and second unit intervals UI_1 and UI_2 of the integration period. As such, no gating control signal (e.g., gate$_1$ or gate$_2$) need be applied to enable/disable the tranconductance cell G$_m$-cell$_1$ or G$_m$-cell$_2$ during the integration period.

In another embodiment, for a given FFE tap that is valid for the entire integration period, the gating control signal may operate to turn on the given FFE tap for a fraction of the integration period so as to limit the contribution of the given tap to the final FFE-equalized voltage. For instance, as shown in FIG. 6, while the first post-cursor data input X1 is valid during both the first and second unit intervals and UI_2 of the integration period, the gating control signal gate$_1$ is shown as being asserted only during the second unit interval UI_2 of the integration period. In other embodiments, the gating control signal may turn on the FFE taps during the first unit interval UI_1 of the integration interval or during the second half of the integration interval. The use of the gating control signal to limit the contribution of a given FFE tap during the integration period is one method that can be implemented to apply a "weight" value to the corresponding data input, i.e., the contributions of the data inputs to the final FFE-equalized voltage are weighted based on the amount of time that the data inputs of the FFE taps are applied during the integration period.

Furthermore, while FIG. 6 shows that the gating control signals are de-asserted (turned off) during the reset phase of the current-integrating summer circuitry 500 of FIG. 5, in another embodiment of the invention, the gating control signals may be asserted for some portion of the reset period as well. This serves to improve circuit performance in high-speed applications where generation of short pulses is difficult.

In the embodiments of FIGS. 5 and 6, each transconductance cell 502 (G$_m$-cell$_0$, G$_m$-cell$_1$, . . . , G$_m$-cell$_3$) converts the respective differential input voltage (C0·X0/$\overline{\text{C0·X0}}$), (C1·X1/$\overline{\text{C1·X1}}$), . . . (C3·X3/$\overline{\text{C3·X3}}$) to an output current during the integration period when the respective gating control signal gate$_0$, gate$_1$, . . . gate$_3$ is logic high. Even if a gating control signal for a given transconductance cell G$_m$-cell$_k$ transitions to logic low before the end of the integration period, the contribution of the given transconductance cell, G$_m$-cell$_k$, to the output voltage at the differential output nodes OUT and OUTB is held by the capacitors C$_1$ and C$_2$ until the end of the integration period. This enables the implementation of FFEs with longer spans, since data signals that are not available for the entire duration of the integration period can now be used in the FFE computation. Due to its inherent memory, a current-integrating summer circuit such as shown in FIG. 5 stores the contribution of each of the FFE taps until the reset period, so that a proper FFE-equalized voltage can be sampled at the end of the integration period. This makes it possible to add pre-cursors and/or post-cursors that are not valid at the same time during the integration period.

Figure 7:
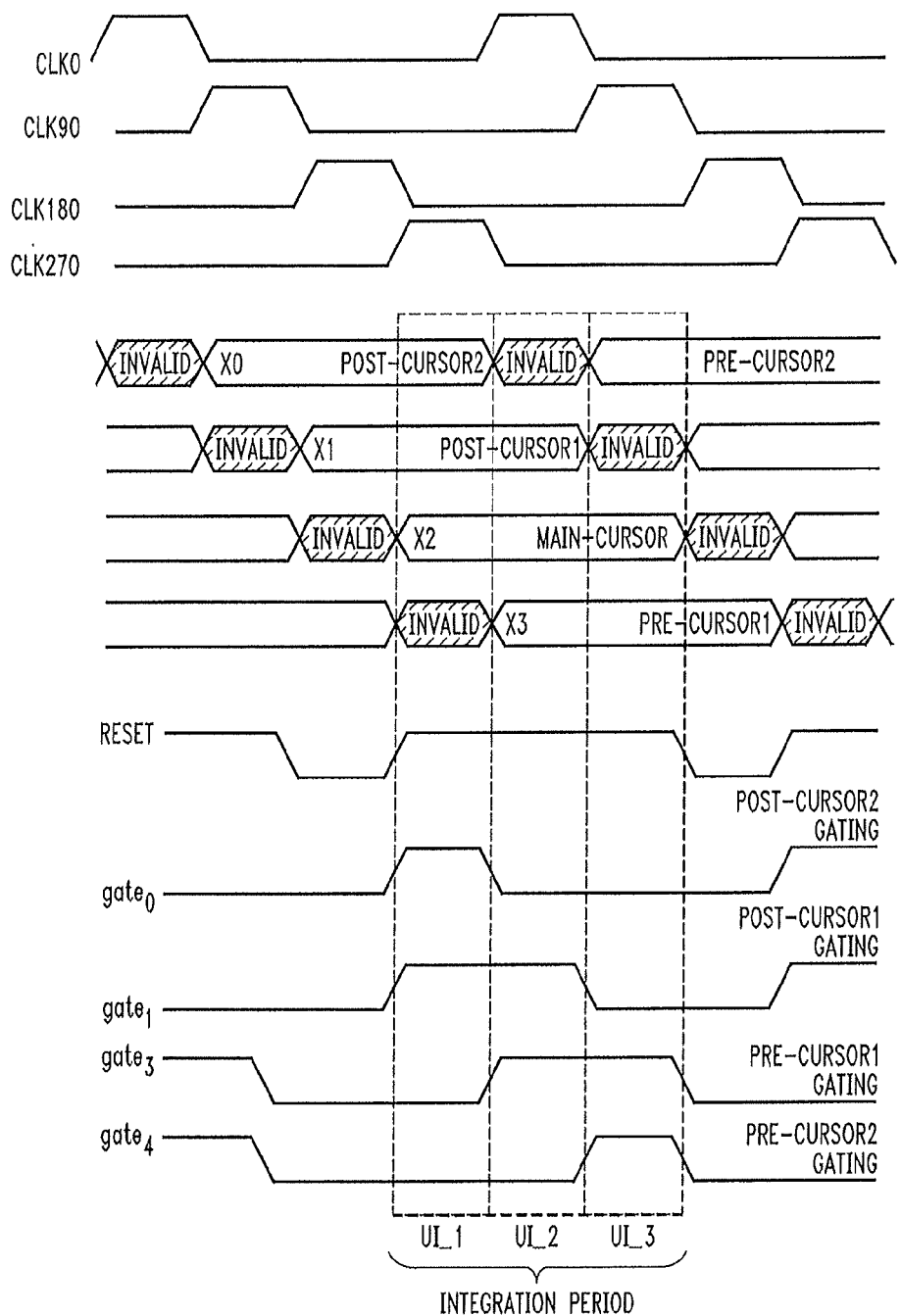
FIG. 7 shows example waveforms that illustrate an operating mode of a quarter-rate feed-forward equalizer circuit that employs a 5-tap current-integrating summer circuit, according to an embodiment of the invention.

FIG. 7 shows example waveforms that illustrate an operating mode of a quarter-rate feed-forward equalizer circuit that implements a 5-tap current-integrating summer circuit, according to an embodiment of the invention. To implement a 5-tap current-integrating summer circuit, the current-integrating circuit 500 of FIG. 5 can be modified to include an additional transconductance cell (e.g., G$_m$-cell$_4$), which receives as input a differential input voltage (C4·X0/$\overline{\text{C4·X0}}$), that includes the same data input X0 input to the first transconductance cell G$_m$-cell$_0$, but with a different weight C4.

Moreover, as shown in FIG. 7, an integration interval is extended to include three unit intervals UI_1, UI_2 and UI_3, with a reset signal having a 75% duty cycle, and gating control signals gate$_0$, gate$_1$, gate$_3$, and gate$_4$ are used to control respective transconductance cells, G$_m$-cell$_0$, G$_m$-cell$_1$, G$_m$-cell$_3$, and G$_m$-cell$_0$ to ensure that a proper FFE-equalized voltage is produced at the differential output nodes OUT/OUTB of the current-integrating summer at the end of the integration period. As shown in FIG. 7, each gating signal is asserted only when the corresponding data signal is valid. As further shown in FIG. 7, the second post-cursor and second pre-cursor are derived from the same signal, X0, but weighted with different FFE coefficients (C0 and C4), and controlled with different gating signals gate$_0$ and gate$_4$, respectively.

Figure 8:
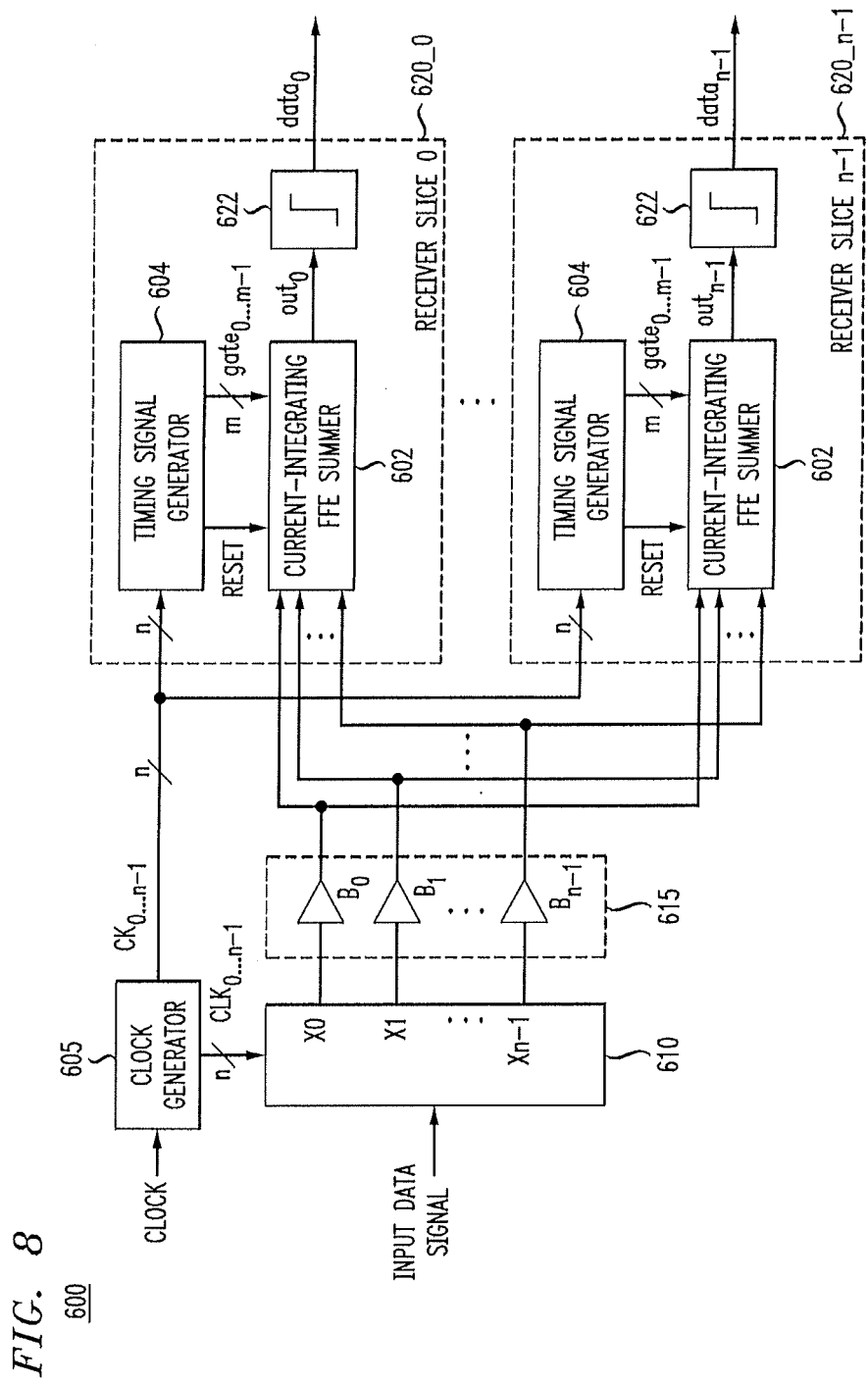
FIG. 8 is a block diagram of a 1/n-rate m-tap FFE receiver circuit according to an embodiment of the invention.

FIG. 8 is a block diagram of a 1/n-rate, m-tap FFE receiver circuit according to an embodiment of the invention. In particular, FIG. 8 illustrates a FFE receiver circuit 600 comprising a clock generator 605, sample-and-hold circuitry 610, buffer circuitry 615, and a plurality of n parallel receiver slices (620_0, . . . , 620_$n$-1). In one embodiment, the sample-and-hold circuitry 610 comprises n parallel sample-and-hold circuits, such as shown in FIG. 2A (e.g., n=4) to implement a (1/n)-rate FFE receiver. Each of the n receiver slices (620_0, . . . , 620_$n$-1) comprises an m-tap current-integrating summer circuit 602, a timing signal generator circuit 604, and a latch 622. In one embodiment, the current-integrating summer circuits 602 and timing signal generator circuits 604 in each of the n receiver slices (620_0, . . . , 620_$n$-1) are implemented using the circuit structure of FIG. 3, for example.

The clock generator 605 receives an input CLOCK and generates a first set of n phase-shifted clock signals (CLK$_0$, . . . , CLK$_{n-1}$) that clock respective ones of the n parallel sample-and-hold circuits of the sample-and-hold circuitry 610. The first set of n phase-shifted clock signals (CLK$_0$, . . . , CLK$_{n-1}$) have duty-cycles that may or may not be 50%. In one embodiment, the first set of n phase-shifted clock signals (CLK$_0$, . . . , CLK$_{n-1}$) include n=4 phase-shifted quadrature clock signals CLK0, CLK90, CLK180 and CLK270 having a 25% duty-cycle, as in the example embodiments discussed above. The clock generator 605 further generates a second set of n phase-shifted clocks (CK$_0$, . . . , CK$_{n-1}$) that are distributed to the timing signal generator circuits 604 in each of the n receiver slices (620_0, . . . , 620_n−1). In one embodiment of the invention, the second set of n phase-shifted clock signals (CK$_0$, . . . , CK$_{n-1}$) have rising edges that are aligned to the rising edges of corresponding ones of the first set of n phase-shifted clock signals (CLK$_0$, . . . , CLK$_{n-1}$), and have duty-cycles that match or do not match the first set of n phase-shifted clock signals (CLK$_0$, . . . , CLK$_{n-1}$). Each timing signal generator circuit 604 comprises Boolean combinatorial logic circuitry to process a subset of the clocks (CK$_0$, . . . , CK$_{n-1}$) to produce gating control signals gate$_0$, . . . , gate$_{m-1}$ and reset signals for the current-integrating summer circuits 602 in each of the n receiver slices (620_0, . . . , 620_n−1).

The sample-and-hold circuitry 610 receives an input data stream having a bit rate of Y bits/sec, and generates n output streams X0, . . . , Xn−1 which are distributed in parallel to each of the current-integrating summer circuits 602 in each of the n receiver slices (620_0, . . . , 620_n−1). For example, assuming that n=4 and the bit rate of the input data signal is 20 Gb/s, the sample-and-hold circuitry 610 outputs n=4 streams of data, X0, X1, X2 and X3 each having a sampling rate of 5 Gsamples/s. In one embodiment, the outputs of the sample-and-hold circuitry are input to respective buffers B$_0$, . . . , B$_{n-1}$ of the buffer circuitry 615, where the output data streams X0, X1, X2 . . . , Xn−1 can be buffered to improve the bandwidth of the sample-and-hold circuitry 610.

In the embodiment of FIG. 8, the current-integrating summer circuits 602 in each of the n receiver slices (620_0, . . . , 620_n−1) can be implemented using any one of the embodiments discussed herein, such as in FIGS. 5, 6, and 7, wherein each current-integrating summer circuit 602 comprises m transconductance cells (FFE taps). Depending on the application, each timing signal generator circuit 604 generates at most m gating control signals (or less in some embodiments where one or more transconductance cells are not gated). The outputs out$_0$, . . . , out$_{n-1}$ of the respective current-integrating summer circuits 602 are input to respective decision-making latch circuits 622, each of which outputs a respective one of the n data streams, data$_0$, . . . , data$_{n-1}$, based on the FFE computation. In the embodiment of FIG. 8, the number of current-integrating FFE taps m can be greater than or equal to n, or m can be less than n.

Figure 9:
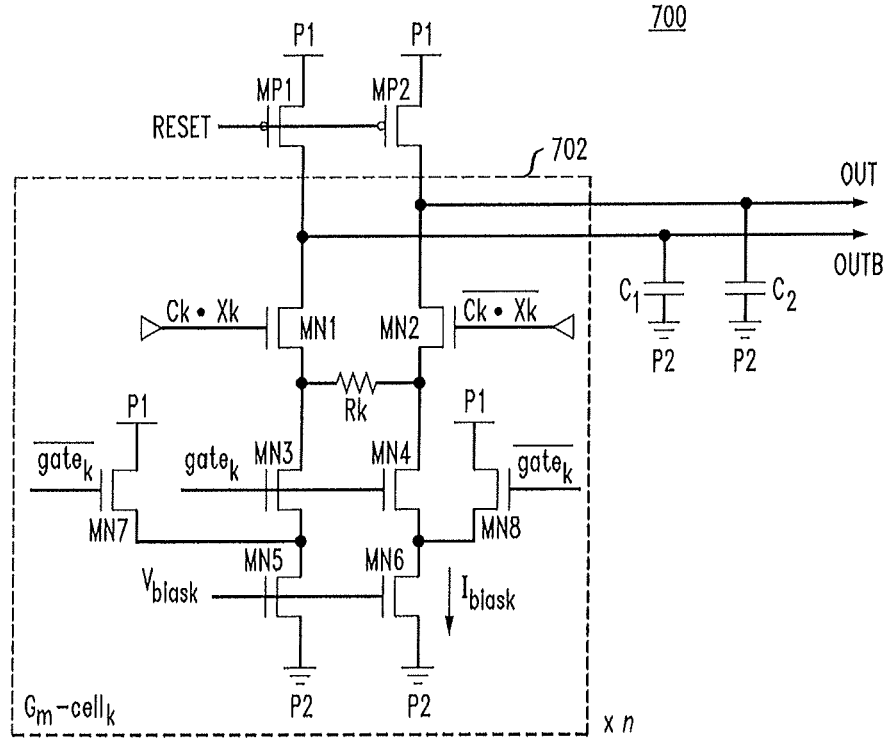
FIG. 9 is a schematic circuit diagram of a current-integrating amplifier circuit according to another embodiment of the invention, which can be used to implement the n-tap current-integrating summer circuit shown in FIG. 3.

FIG. 9 is a schematic circuit diagram of a current-integrating amplifier circuit according to another embodiment of the invention, which can be used to implement the n-tap current-integrating summer circuit shown in FIG. 3. More specifically, FIG. 9 illustrates a current-integrating amplifier circuit 700 which is similar to the current-integrating amplifier circuit 400 of FIG. 4A, but which further includes additional transistors MN7 and MN8 to steer the currents in the given FFE tap to a reference node when the gating control signal (gate$_k$) turns off the FFE tap. More specifically, as shown in FIG. 9, the NMOS transistor MN7 is connected between the first power supply node P1 and a drain terminal of the tail current source transistor MN5, and the NMOS transistor MN8 is connected between the first power supply node P1 and a drain terminal of the tail current source transistor MN6. A complementary gating control signal $\overline{gate_k}$ is applied to the gate terminals of the NMOS transistors MN7 and MN8. As such, when the given FFE tap is disabled by a logic low gating control signal, i.e., gate$_k$=logic low, then the NMOS transistors MN7 and MN8 are turned on in response to the complementary (logic high) signal $\overline{gate_k}$, which keeps the current source transistors MN5 and MN6 in saturation even when the FFE tap is turned off. This circuit structure improves the accuracy of the FFE computation by avoiding unwanted surge currents that would otherwise introduce errors caused by repeatedly turning on and off the currents in the tail transistors MN5 and MN6 when the gating control signal gate$_k$ enables and disables the FFE tap.

While the embodiments described thus far employ gating transistors MN3 and MN4 that are responsive to a gating control signal gate$_k$ to enable and disable the FFE taps, the gating operation can be implemented using other techniques. For example, in one embodiment of the invention, a gating operation is implemented by switchably coupling the gate terminals of the tail current source transistors MN5 and MN6 to ground voltage to disable the FFE tap. In another embodiment, the gate terminals of the FFE input differential transistor pair MN1 and MN2 may be disconnected from the FFE input signals and connected to a common-mode signal to disable the FFE tap. In yet another embodiment, the gating transistors MN3 and MN4 of each FFE tap are connected between the differential input transistor pair MN1 and MN2 and the source-degenerating resistor Rk.

Figure 10:
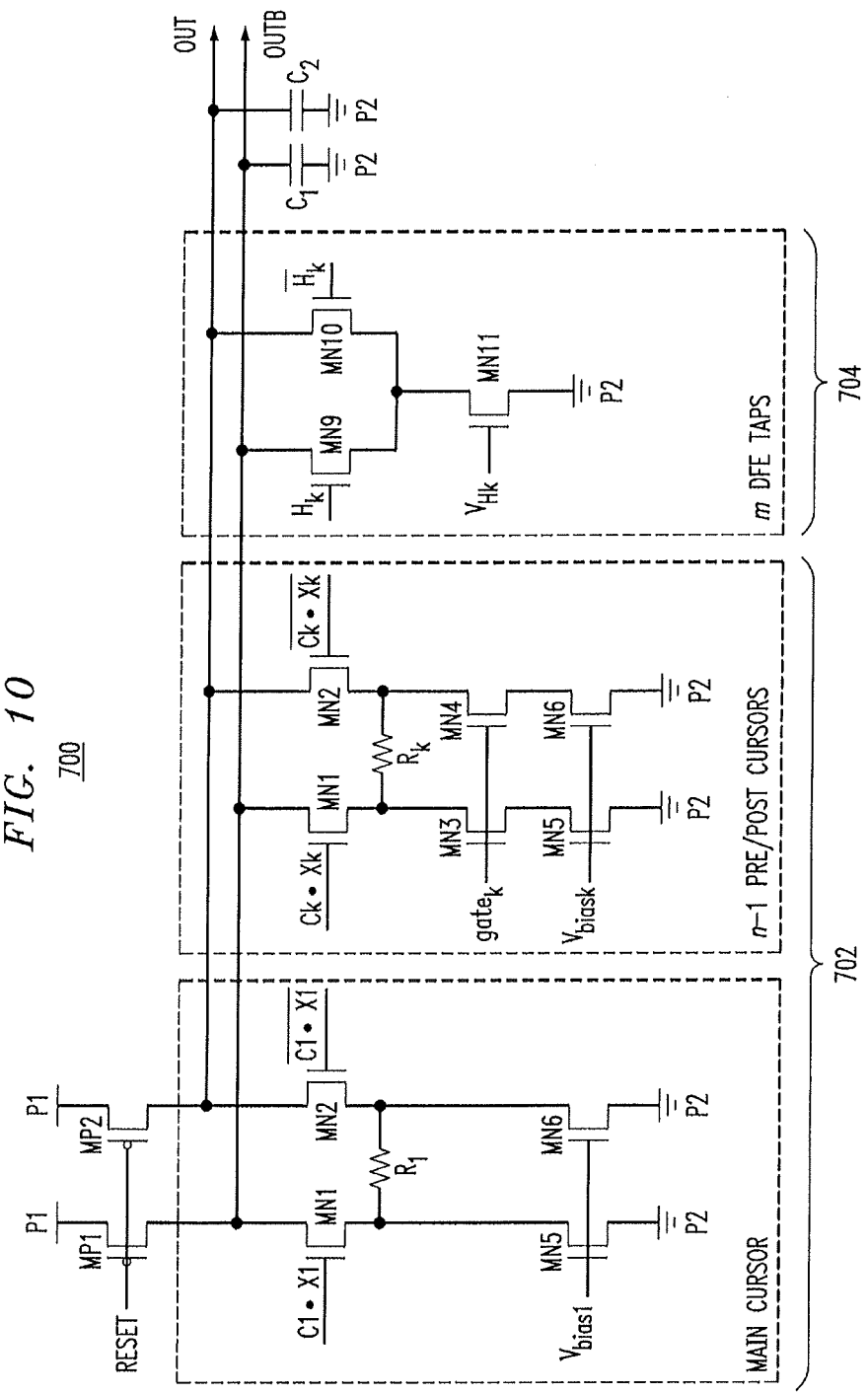
FIG. 10 is a schematic circuit diagram of a current-integrating summer circuit which implements n feed-forward taps and m decision feedback taps, according to another embodiment of the invention.

In other embodiments of the invention, a current-integrating summer circuit can be implemented using both FFE taps and DFE (decision feedback equalization) taps. For example, FIG. 10 is a schematic circuit diagram of a current-integrating summer circuit which implements n feed-forward taps and m decision feedback taps, according to another embodiment of the invention. More specifically, FIG. 10 illustrates a current-integrating summer circuit 700 which comprises a plurality of n FFE taps 702 and a plurality of m DFE taps 704. The FFE taps 702 comprise a main cursor stage and (n−1) FFE pre-cursor and post-cursor taps. The n FFE taps 702 are constructed using transconductance cells such as discussed above with reference to FIGS. 4A and 5, for example. In the embodiment of FIG. 10, the main cursor stage of the FFE taps 702 does not include gating transistors MN3 and MN4, wherein it is assumed that the data input X1 for the main cursor is valid during an entire integration period.

Furthermore, as shown in FIG. 10, each of the m DFE taps comprises a differential transistor pair MN9 and MN10 that receives as input, different feedback taps, generally denoted H$_k$ and $\overline{H_k}$. In general, as is well-understood by those of ordinary skill in the art, a DFE uses the history of previously decided bits to calculate their contributions to the intersymbol interference (ISI) of the current bit so that the ISI can be cancelled. More specifically, in a DFE, the previously decided bits are fed back with weighted tap coefficients and added to the received input signal. For an m-tap DFE, the feedback taps are H1, H2, . . . , Hm. The H1 tap represents the ISI contributed by a data bit one UI earlier than the current bit being detected, the H2 tap represents the ISI contributed by a data bit two UIs earlier than the current bit, and so on. If the magnitudes and polarities of the tap weights are properly adjusted to match the channel characteristics, the ISI from the previous bits in the data stream will be cancelled, and the bits can be detected by a decision-making latch with a low BER (bit error rate).

Other straightforward modifications and variations of the disclosed embodiments, such as changing NMOS transistors to PMOS types, and vice versa, will be obvious to those skilled in the art. Such modifications and variations do not depart from the spirit and scope of the invention.

Further aspects of the present invention provide FFE architectures with current-integrating summer circuits as described herein, which can be utilized in integrated circuit chips with various analog and digital integrated circuitries. In particular, integrated circuit dies can be fabricated having current-integrating summer circuits with FFE and DFE taps and other semiconductor devices such as field-effect transistors, bipolar transistors, metal-oxide-semiconductor transistors, diodes, resistors, capacitors, inductors, etc., forming analog and/or digital circuits. The current-integrating summer circuits can be formed upon or within a semiconductor substrate, the die also comprising the substrate. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

Although exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method for equalizing a data signal, comprising:
generating n time-delayed versions of an input data signal;
inputting m data signals to m feed-forward equalization (FFE) taps of a current-integrating summer circuit, wherein each of the m data signals corresponds to one of the n time-delayed versions of the input data signal;
charging a capacitance to a precharge level during a reset period of the current-integrating summer circuit;
generating an output current by each of the m FFE taps during an integration period of the current-integrating summer circuit, wherein the output currents from the m FFE taps collectively charge or discharge the capacitance during the integration period; and
applying a gating control signal to at least one FFE tap of the m FFE taps during the integration period of the current-integrating summer circuit to disable the at least one FFE tap during a portion of the integration period in which the data signal input to the at least one FFE tap is invalid.

2. The method of claim 1, wherein each of the m FFE taps is a transconductance amplifier circuit.

3. The method of claim 1, wherein the integration period is two or more unit intervals in time.

4. The method of claim 1, wherein at least two different FFE taps receive as input a same data signal that corresponds to one of the n time-delayed versions of the input data signal, and wherein the at least two different FFE taps are gated by different gating control signals.

5. The method of claim 1, wherein at least two different FFE taps receive as input different data signals that correspond to different ones of the n time-delayed versions of the input data signal, and wherein the different data signals are not valid at a same time during the integration period.

6. The method of claim 1, wherein each of the m FFE taps is a differential transconductance amplifier with source degeneration.

7. The method of claim 1, wherein generating n time-delayed versions of an input data signal comprises using multiphase clocks for clocking n parallel sample-and-hold circuits to generate the n time-delayed versions of the input data signal.

8. The method of claim 1, wherein charging a capacitance to a precharge level during a reset period of the current-integrating summer circuit comprises charging a parasitic capacitance.

9. The method of claim 1, wherein charging a capacitance to a precharge level during a reset period of the current-integrating summer circuit comprises charging a discrete capacitor element.

10. The method of claim 1, wherein inputting m data signals to m FFE taps of a current-integrating summer circuit comprises inputting at least one data signal into an FFE tap which is a weighted version of one of the n time-delayed versions of the input data signal.

11. The method of claim 1, further comprising directly inputting at least one of the n time-delayed versions of the input data signal to one of the m FFE taps not controlled by a gating control signal.

12. The method of claim 1, further comprising generating an output current using at least one decision feedback equalization (DFE) tap connected to an output node of the current—integrating summer circuit.

13. The method of claim 1, further comprising maintaining a bias current source of the at least one FFE tap active during a portion of the integration period in which the at least one FFE tap is disabled by the gating control signal.

* * * * *